(12) United States Patent
Dickinson et al.

(10) Patent No.: US 8,447,543 B2
(45) Date of Patent: May 21, 2013

(54) ELECTRIC VEHICLE SIMULATOR AND ANALYZER (EVSA) FOR ELECTRIC VEHICLE SUPPLY EQUIPMENT

(75) Inventors: Blake Edward Dickinson, Monrovia, CA (US); Albert Joseph Flack, Garden Grove, CA (US); Keith Michael Kolb, West Covina, CA (US); Scott Garret Berman, Los Angeles, CA (US)

(73) Assignee: Aerovironment, Inc., Monrovia, CA (US)

( * ) Notice: Subject to any disclaimer, the term of this patent is extended or adjusted under 35 U.S.C. 154(b) by 0 days.

(21) Appl. No.: 13/145,785

(22) PCT Filed: Sep. 8, 2010

(86) PCT No.: PCT/US2010/048179
§ 371 (c)(1),
(2), (4) Date: Sep. 23, 2011

(87) PCT Pub. No.: WO2011/031801
PCT Pub. Date: Mar. 17, 2011

(65) Prior Publication Data
US 2012/0022811 A1 Jan. 26, 2012

Related U.S. Application Data

(60) Provisional application No. 61/240,577, filed on Sep. 8, 2009, provisional application No. 61/246,469, filed on Sep. 28, 2009.

(51) Int. Cl.
*G01R 21/00* (2006.01)
(52) U.S. Cl.
USPC .................. 702/60; 702/58; 702/63; 702/64
(58) Field of Classification Search
None
See application file for complete search history.

(56) References Cited

U.S. PATENT DOCUMENTS

| 5,272,431 A * | 12/1993 | Nee ................................ 320/109 |
| 5,386,183 A | 1/1995 | Cronvich et al. |
| 5,583,418 A * | 12/1996 | Honda et al. ................... 320/109 |
| 6,005,369 A | 12/1999 | Rogers |
| 2006/0028178 A1 | 2/2006 | Hobbs |
| 2009/0085575 A1 | 4/2009 | Lindsey et al. |
| 2010/0270860 A1 * | 10/2010 | Kamaga ....................... 307/10.7 |

FOREIGN PATENT DOCUMENTS

JP 10-322920 12/1998

OTHER PUBLICATIONS

"Electric Vehicle Infrastructure's Product Line of Charging Stations" website, Retrieved from the Internet Jul. 21, 2011, <URL:http://www.bowzerbird.com/eviweb/products2.html>.
International Search Report for Serial No. PCT/US2010/048179 mailed May 9, 2011.
"SAE Electric Vehicle Conductive Charge Coupler", SAE J1772 manual, Revised Aug. 2001.
"Personnel Protection Systems for Electric Vehicle (EV) Supply Circuits:Particular Requirements for Protection Devices for Use in Charging Systems" UL 2231-2, May 1, 2012, ISBN: 0-7625-0770-3.

* cited by examiner

*Primary Examiner* — Elias Desta
(74) *Attorney, Agent, or Firm* — Brooks Acordia IP Law, PC; Eric Aagaard

(57) ABSTRACT

Embodiments pertain to devices and systems having simulator circuitry, particularly to simulator circuitry configured to simulate an electric vehicle and test an electric vehicle charger. A test unit is configured to simulate a GFI current via modulator and to simulate electric vehicle loads via switched and combined resistor loads. The test unit provides for reprogramming of the electric vehicle charger via a pilot line. The test unit self-confirms its usability via associating received codes.

4 Claims, 19 Drawing Sheets

ELECTRIC VEHICLE SIMULATOR AND ANALYZER (EVSA) FOR ELECTRIC VEHICLE SUPPLY EQUIPMENT

CROSS-REFERENCE TO RELATED APPLICATIONS

This application is a 371 application of International Application No. PCT/US2010/048179 filed Sep. 8, 2010, which claims the benefit of U.S. Provisional Application No. 61/240,577 filed Sep. 8, 2009, and this application also claims the benefit of U.S. Provisional Application No. 61/246,469, filed Sep. 28, 2009, the disclosures of all of which are incorporated herein by reference in their entirety.

TECHNICAL FIELD

Embodiments pertain to simulator circuitry, particularly to simulator circuitry configured to simulate an electric vehicle and test an electric vehicle charger.

BACKGROUND

Methods and apparatuses for simulating an automated battery tester with a fixed resistance load have been proposed.

SUMMARY

Method and system embodiments include a device configured to simulate an electric vehicle charging system, the device comprising: (a) a charge plug interface; (b) means for simulating pilot line feedback; (c) means for simulating electric vehicle load; and (d) means for simulating a ground fault interrupt current. The means for simulating pilot line feedback may comprise circuitry configured to initiate a pilot voltage drop to confirm readiness to accept energy. The means for simulating electric vehicle load may comprise a plurality of resistor banks, selectable via microcontroller-controlled switches, having a load approximating an expected load of an electric vehicle. The means for simulating a ground fault interrupt current may comprise a modulator circuit comprising a modulator generating a pulse width modulating signal having a microcomputer-controlled duty cycle.

Method and system embodiments include a device configured to simulate a ground fault interrupt (GFI) current where the device comprises: (a) a modulator circuit comprising a modulator having a duty cycle of pulse width modulation adjustable via a microprocessor input, the modulator circuit configured to provide linear adjustments to a voltage divider ratio as a function of the duty cycle of the pulse width modulation to thereby generate a voltage signal; and (b) a voltage-to-current converter configured to generate a simulated GFI current as a function of the voltage signal generated by the modulator circuit. The device may further comprise a current-to-voltage converter configured to measure the simulated GFI current from the voltage-to-current converter, and configured to convert the measured simulated GFI current to a voltage representative of the simulated GFI current; and an analog-to-digital converter configured to convert the representative voltage to a digital microprocessor feedback signal.

A test unit embodiment for evaluating an electric vehicle charging device may comprise an interface configured to receive a code associable with a data store; and a microprocessor having access to the data store; wherein the microprocessor is configured to: (a) receive a first code and associate the first code with the electric vehicle charging device; (b) receive a second code and associate the second code with a work order; and (c) receive a third code and associate the third code with a person requesting to address the work order; and (d) permit use of the test unit with the electric vehicle charging device based on a confirmation of at least two of: (i) code of the electric vehicle charging device; (ii) code of a work order; and (iii) code of the requesting person. The interface, of the exemplary test unit embodiment configured to receive a code associable with a data store, may be a barcode reader input module, where the first code is a first read barcode, the second code is a second read barcode, and the third code is a third read barcode.

An embodiment may include a method for determining permission to evaluate an electric vehicle charging device by a test unit, the exemplary method comprising: (a) receiving a first code representing the electric vehicle charging device; (b) receiving a second code representing a work order; (c) receiving a third code representing a person requesting to address the work order; and (d) if at least two of the codes are associable to permit access to the electric vehicle charging device, granting, by the test unit, permission for the test unit to access the electric vehicle charging device. The first code of the exemplary method may be a first read barcode, the second code may be a second read barcode, and the third code may be a third read barcode.

Another exemplary test unit for evaluating an electric vehicle charging device, may comprise a configurable load simulator wherein a first load simulating a first electric vehicle load is available via a first microprocessor-controlled switch being closed and a second microprocessor-controlled switch being open, a second load simulating a second electric vehicle load is available via the first microprocessor-controlled switch being open and the second microprocessor-controlled switch being closed, and a third load simulating a third electric vehicle load is available via the first microprocessor-controlled switch being closed and the second microprocessor-controlled switch being closed. For some embodiments, the first load may be about 2.2 kilowatts, the second load may be about 4.4 kilowatts, and the third load may be about 6.6 kilowatts.

A test unit embodiment, for evaluating an electric vehicle charging device, may comprise: (a) a microprocessor and memory wherein the memory comprises instructions for the electric vehicle charging device; and (b) a circuit configured to convert the instructions from the microprocessor for transmission to the electric vehicle charging device via a pilot line.

Another test unit embodiment, for evaluating an electric vehicle charging device, may comprise: (a) analog to digital conversion circuitry configured to receive analog signals from the electric vehicle charging device and convert at least a portion of the received analog signals into digital signals; and (b) a microprocessor and data store wherein converted digital signals may be stored, the microprocessor configured to receive at least a portion of the digital signals and save them to the data store.

BRIEF DESCRIPTION OF THE DRAWINGS

Embodiments are illustrated by way of example and not limitation in the figures of the accompanying drawings, and in which.

DETAILED DESCRIPTION

Electric Vehicles (EVs) and Plug-In Hybrid Electric Vehicles (PHEVs) are being offered in the market and require an AC electric supply in order to charge the vehicle batteries. The device that supplies the AC electricity to the electric vehicle is known as Electric Vehicle Supply Equipment (EVSE). If an electric vehicle is not present there is generally no way to test the function of the EVSE. Embodiments, may include an automated circuit to simulate the actions of a J1772 based charger pilot signal. An automated circuit to simulate the actions of a SAE-J1772 based charger pilot signal and the supporting Electric Vehicle Supply Equipment (EVSE) functions, particularly an EVSE service tool for verifying the installation, debugging and troubleshooting the operational issues in the field. Some embodiments may operate as an EVSE service tool for verifying the installations and debugging and troubleshooting the operation issues in the field. Embodiments enable the EVSE to be tested and serviced with or without an EV or PHEV connected, and thereby reduce potential damage to the EV or PHEV that may be caused by a faulty EVSE.

Figure 1:
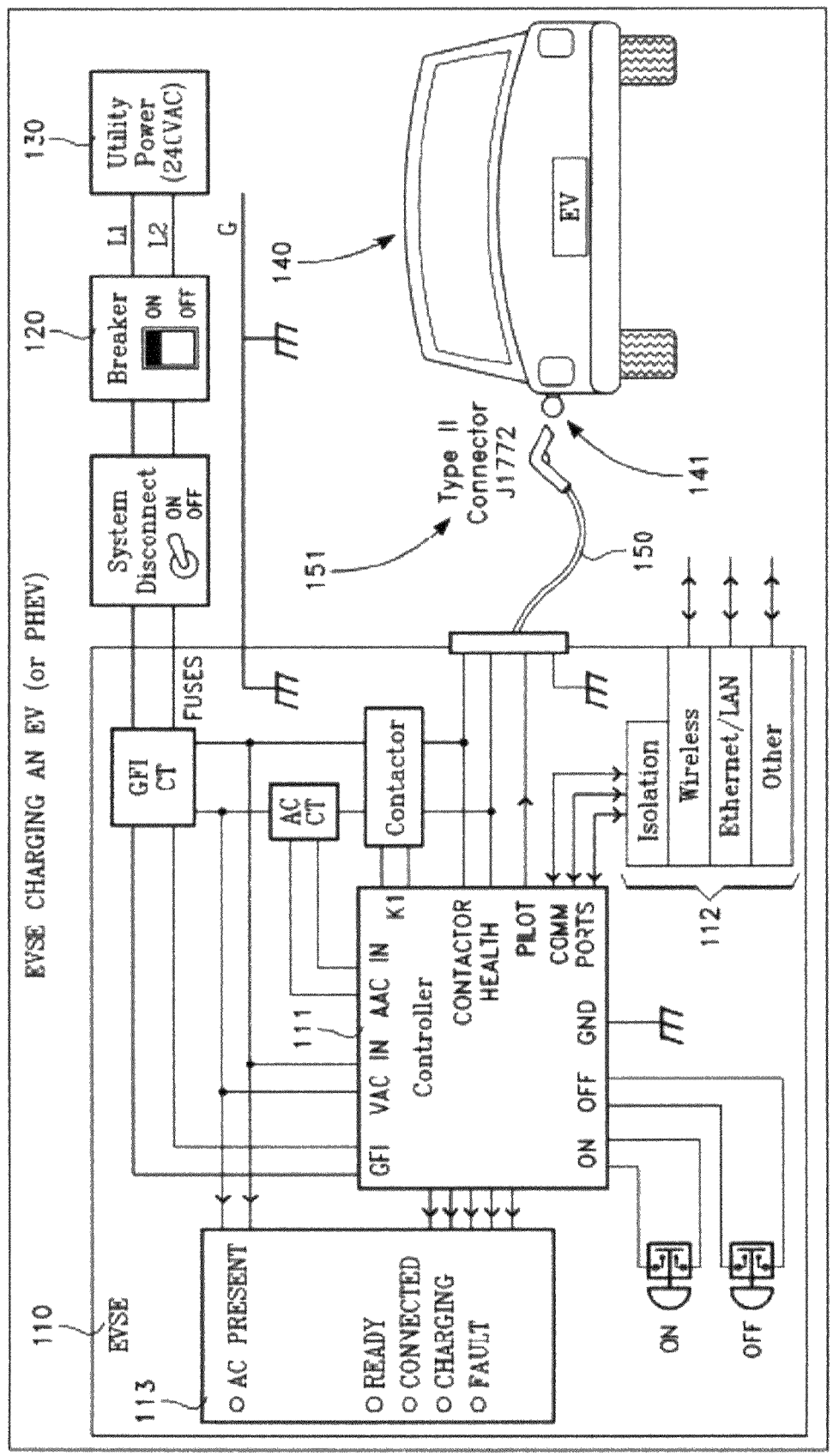
FIG. 1 is an exemplary embodiment of an electric vehicle supply equipment (EVSE) charging an electric vehicle (EV) (or plug-in hybrid electric vehicles (PHEV))

FIG. 1 is an exemplary embodiment of an electric vehicle supply equipment (EVSE) charging an electric vehicles (EV), or plug-in hybrid electric vehicles (PHEV). An EVSE 110 is depicted as connected via a breaker 120 to a utility power source 130. The EVSE 110 is depicted as having a microcontroller 111, a status panel 113, and means of interfacing 112 such as wireless, Ethernet, and other means as a universal serial bus (USB). The EVSE 110 is depicted as connectable to an electric vehicle 140 having a receiving port 141 via a cable 150 having a connector 151 such as a J1772 (type II) connector 151.

Figure 2:
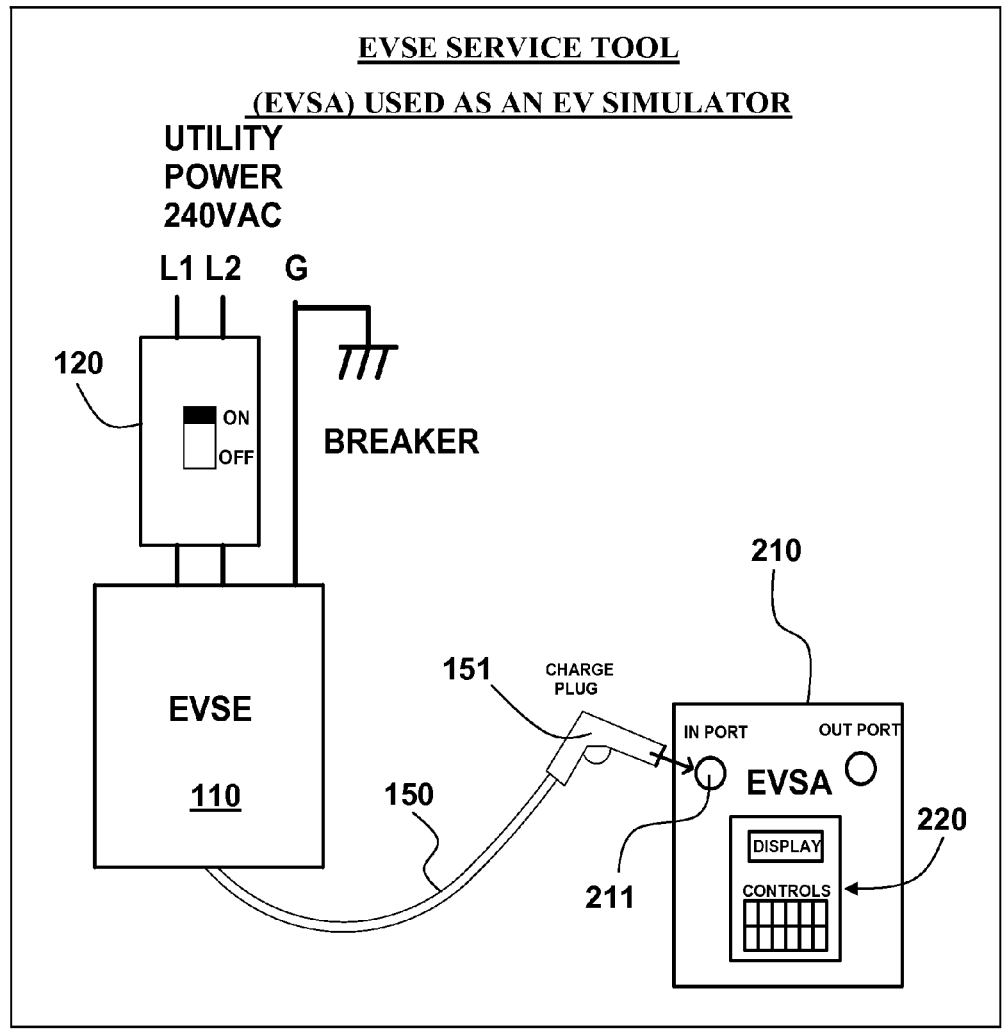
FIG. 2 depicts a top-level system block diagram of an EVSE to EVSE service tool (EVSA) embodiment.
Figure 3:
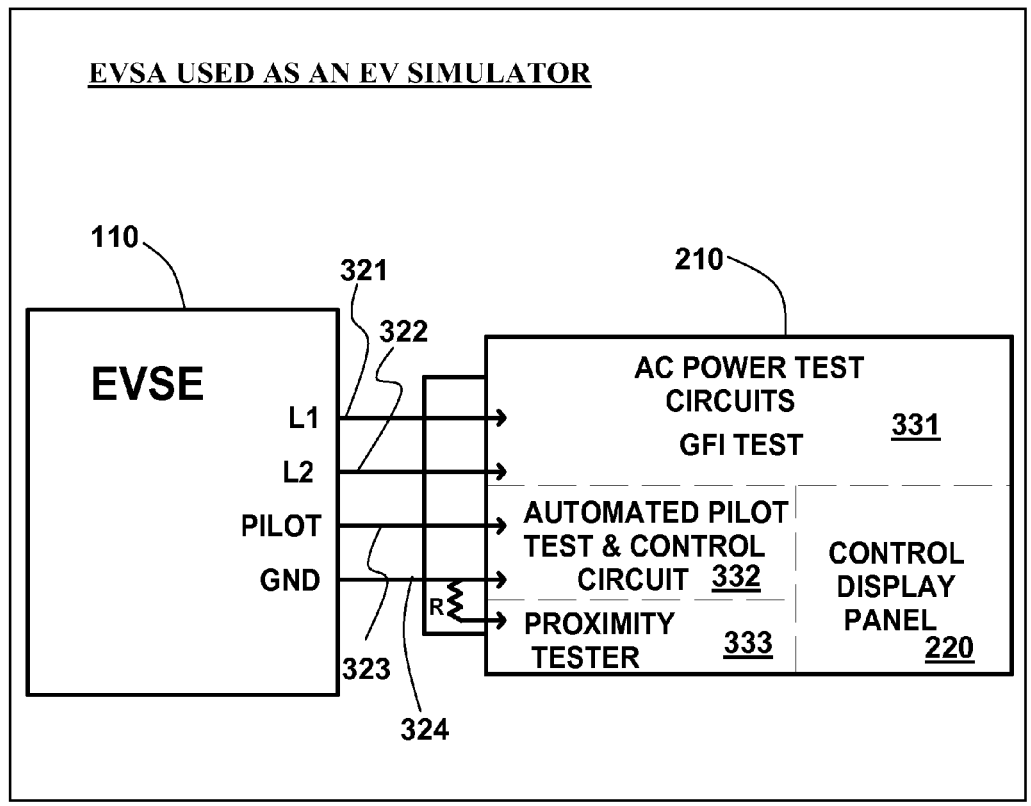
FIG. 3 depicts a top-level block diagram of EVSE installation with EVSA.

An EVSE service tool (EVSA) may be used to simulate an EV and thereby support the testing of the functionality of the EVSE. FIG. 2 depicts a top-level system block diagram of an EVSE 110 to EVSA embodiment where the EVSE service tool (EVSA) 210 has a port 211 for receiving the charge plug 151, and having a user interface depicted as a panel 220 for display and control input. FIG. 3 depicts a top-level block diagram of an EVSE 110 installation with EVSE Service Tool (EVSA) 210 where power line 1 (L1) 321, power line 2 (L2) 322, a pilot line 323, and a ground line 324 are depicted as engaging the service tool 210. The power line 1 (L1) 321 and power line 2 (L2) 322 are depicted as provided to AC power test circuits and GFI test circuits 331. The pilot line 323 is depicted as provided to the automated pilot test and control circuitry 332, and the ground line 324 is depicted as provided to the automated pilot test and control circuitry 332, and to a proximity tester 333. With an EVSE connected to AC power, the EVSE output J1772 connector may be attached to a J1772 receptacle on the device. Following a proper sequence as outlined in J1772, the EVSA will then typically drop the initial EVSE voltage of 12V to a voltage of 9V which indicates "connected" between the EVSE and the EVSE service tool, i.e., the simulated EV. The automatic sequencer of the EVSE service tool (EVSA) may then initiate a pilot voltage drop to 6V as a "charging" indication (or 3V for a 'vent required" charge) to confirm that the EVSA is ready to accept energy. The EVSA may read the pulse width of the pilot signal from the EVSE in order to determine the maximal current draw from the EVSE, and display the reading to the servicing person. The EVSE may then close the contactor, and provide AC voltage to the EVSA. The EVSA may comprise load steps that the service personnel can apply in steps. The EVSA may dissipate energy through the load device verifying that the EVSE is capable of providing current to an EV. The EVSA may also generate a Ground Fault Interruption (GFI) current to test the ground fault circuit in the EVSE. The voltage monitor circuit in the EVSA may provide over/under voltage indication, for example. The voltage monitor may also determine the system impedance of the EVSE in conjunction with the load capability. Various controls in the EVSA may also allow the servicing person to test other functions such as, but not limited to, "loss of pilot," "loss of ground," and "incorrect pilot voltage level." Standard fused meter connectors may be provided to allow the servicing person safe access to the system voltages and signals for monitoring purposes.

Figure 4:
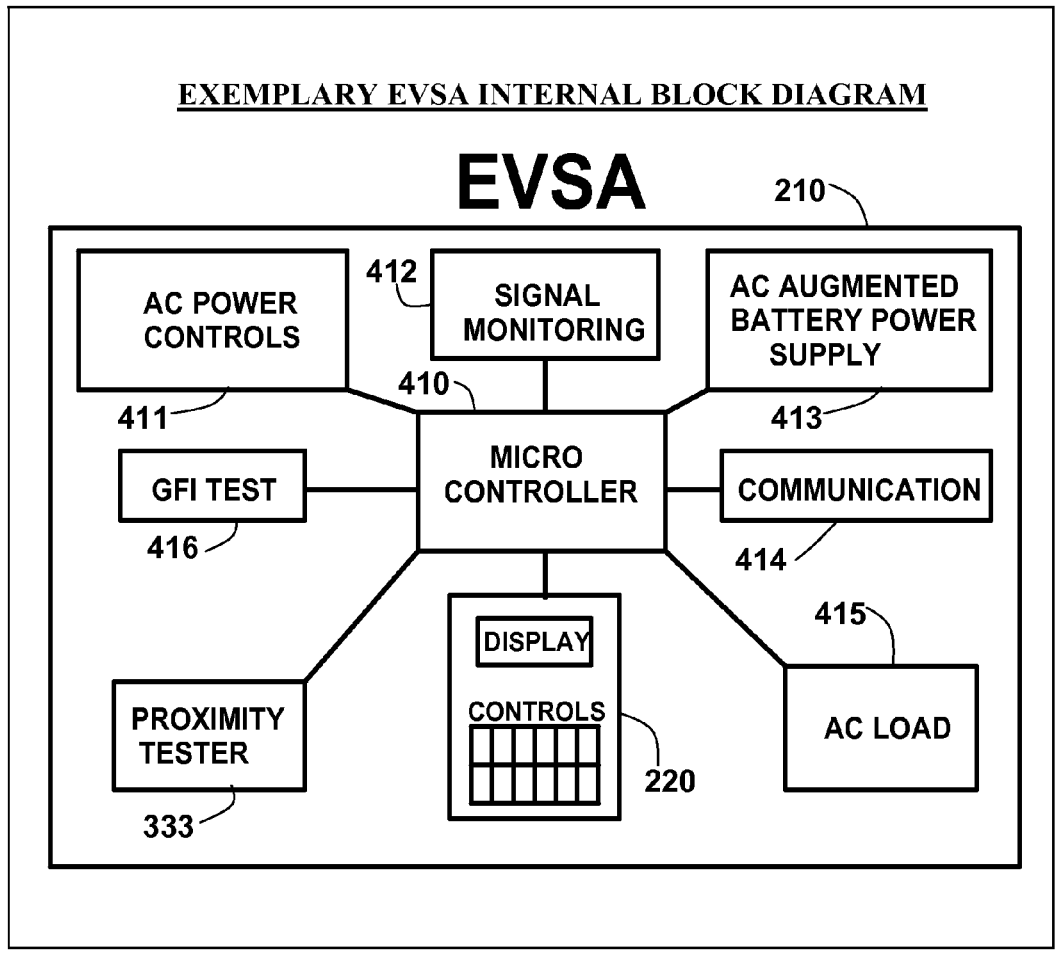
FIG. 4 is a top-level EVSA functional block diagram.

FIG. 4 is a top-level EVSE service tool (EVSA) functional block diagram depicting a microcontroller 410 of the service tool 210 in communication with AC power controls 411, signal monitoring circuitry 412, AC augmented battery power supply circuitry 413, communication circuitry 414, AC load circuitry 415, a user interface 220, a proximity tester 333, and GFI testing circuitry 416.

Figure 5:
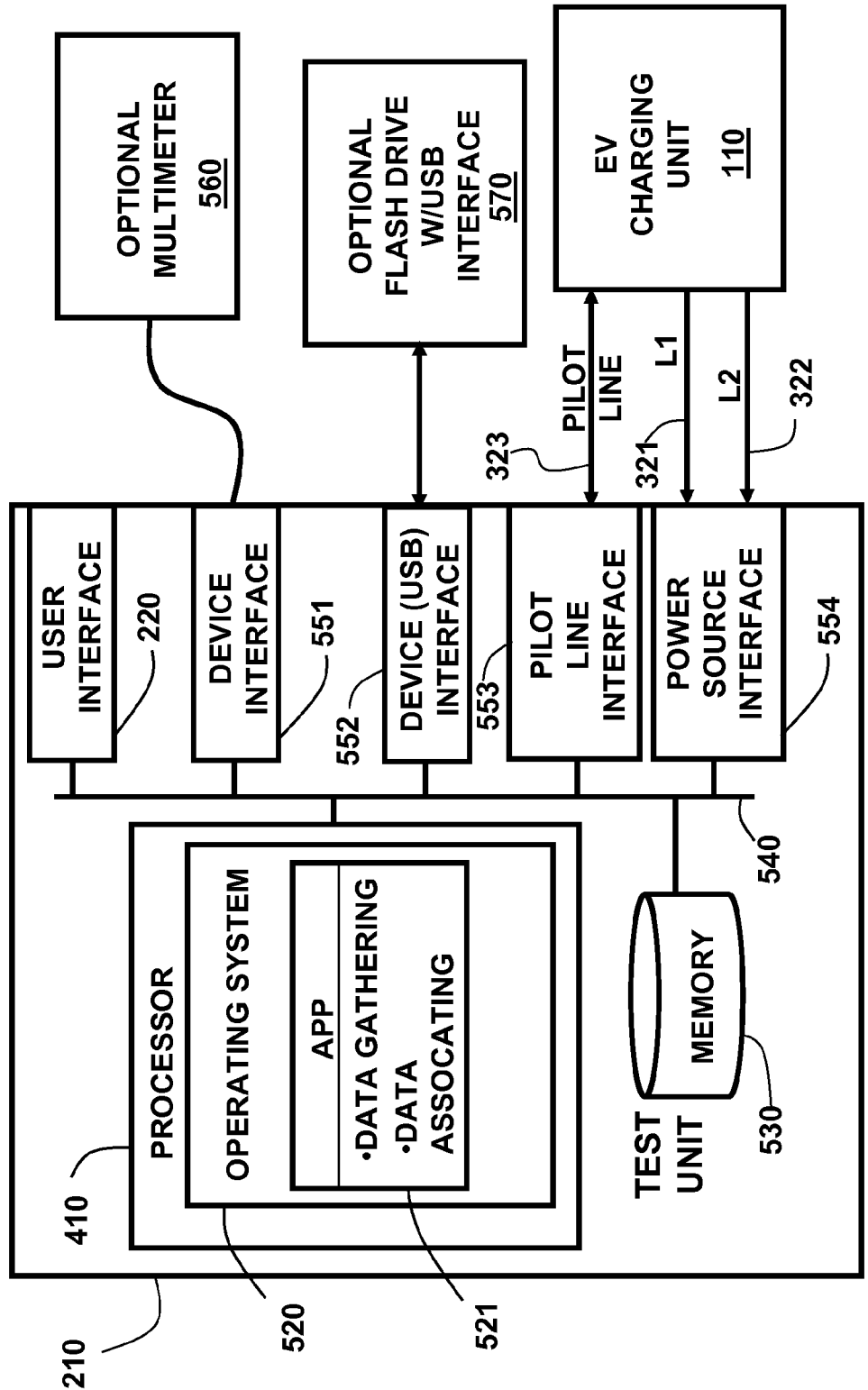
FIG. 5 is a functional block diagram of a portion of the EVSA.

FIG. 5 is a functional block diagram of a portion of the EVSE service tool (EVSA) 210, or test unit, where the service tool is depicted as having a microprocessor 410 running an operating system 520 that supports an application 521 executing steps of data gathering, data associating, and preparing associated data for transmission. The microprocessor 410 is depicted as in communication via a data bus 540 with a memory store 530 where the microprocessor 410 may store the data. The microprocessor 410 is also depicted as being in communication with a user interface 220, a device interface 551 that may engage an optional multimeter 560 or multimeter circuitry or digital input such as the output of a barcode scanner or barcode input module. The microprocessor 410 is also depicted as being in communication with another device interface 552 that may be a USB port configured to engage an optional flash drive 570 having a USB interface. The microprocessor 410 is also depicted as being in communication with a pilot line interface 553 that may receive input from the pilot line 323 of the EV charging unit 110. The microprocessor 410 is also depicted as being in communication with power line L1 321 and power line L2 322 of the EV charging unit 110 via a power source interface 554.

Figure 6:
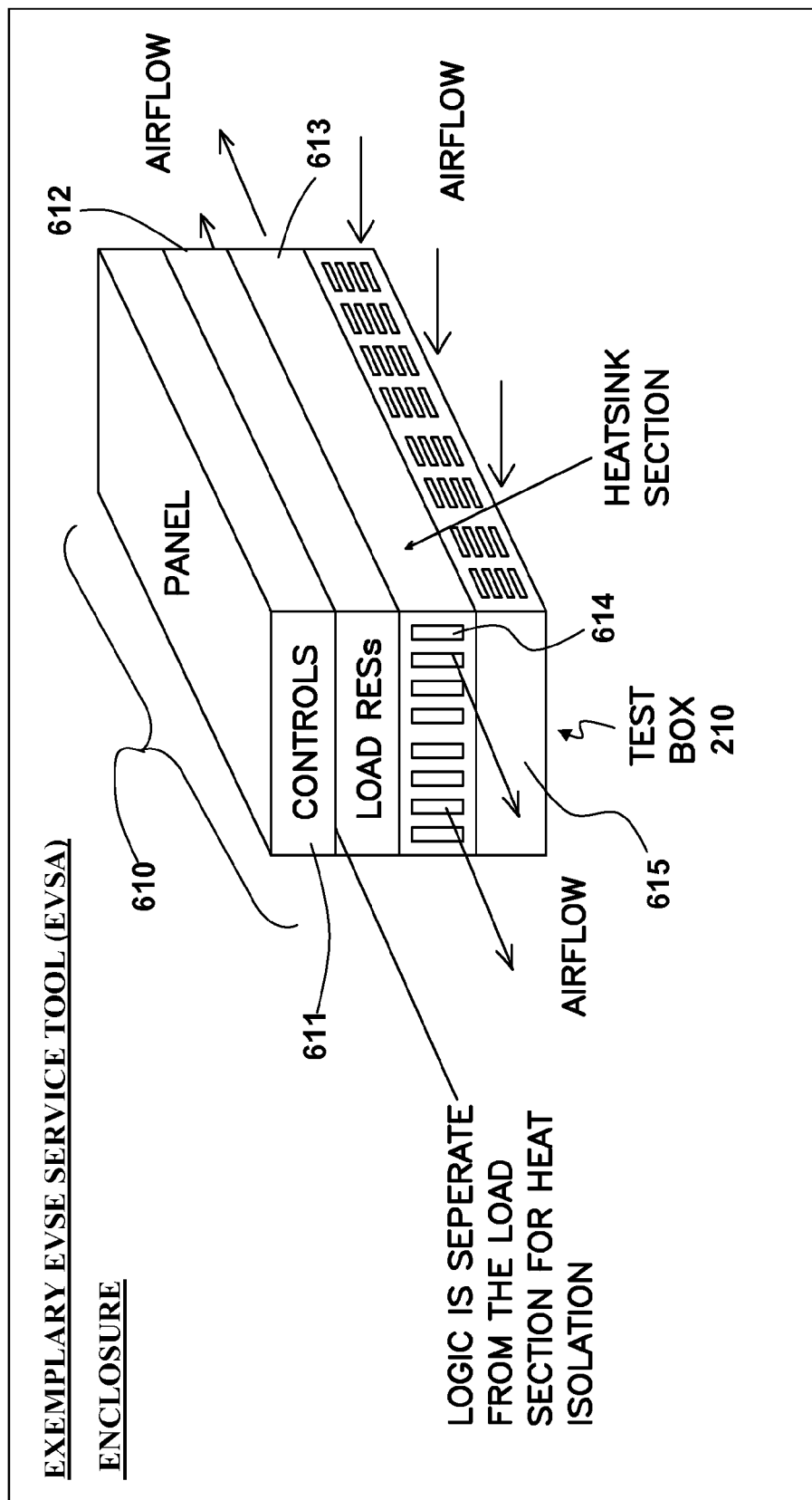
FIG. 6 is an exemplary EVSA enclosure.

FIG. 6 is an exemplary EVSE service tool (EVSA) enclosure 610 where a control circuitry layer 611 may be separate from a layer of banks of resistors 612. A first heat sink layer 613 is depicted as abutting the layer of banks of resistors 612, and comprising airflow ducting 614. A second heat sink layer 615 is depicted as abutting the first heat sink layer 613.

Figure 7:
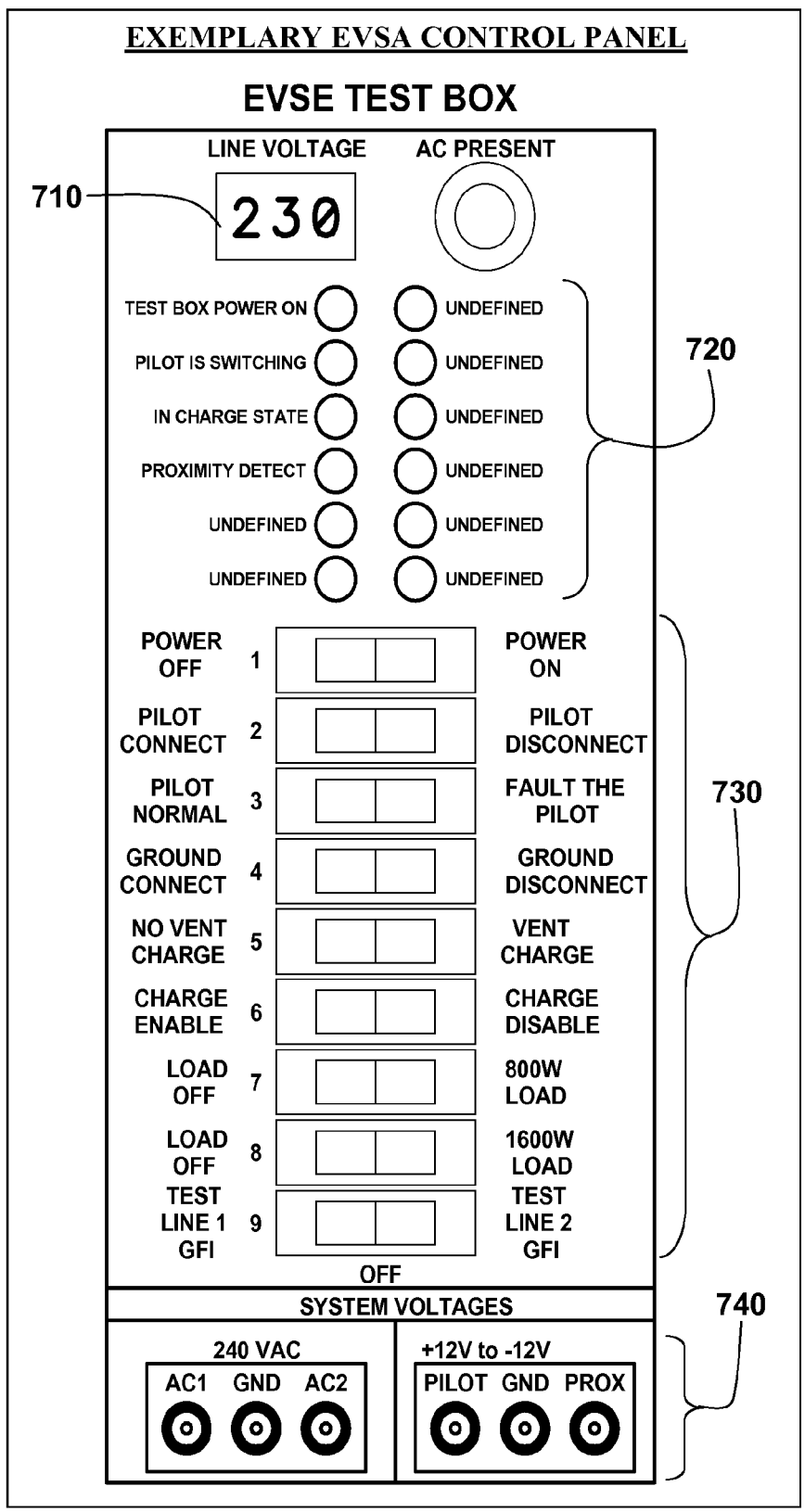
FIG. 7 is an exemplary depiction of an EVSA control panel.
Figure 8:
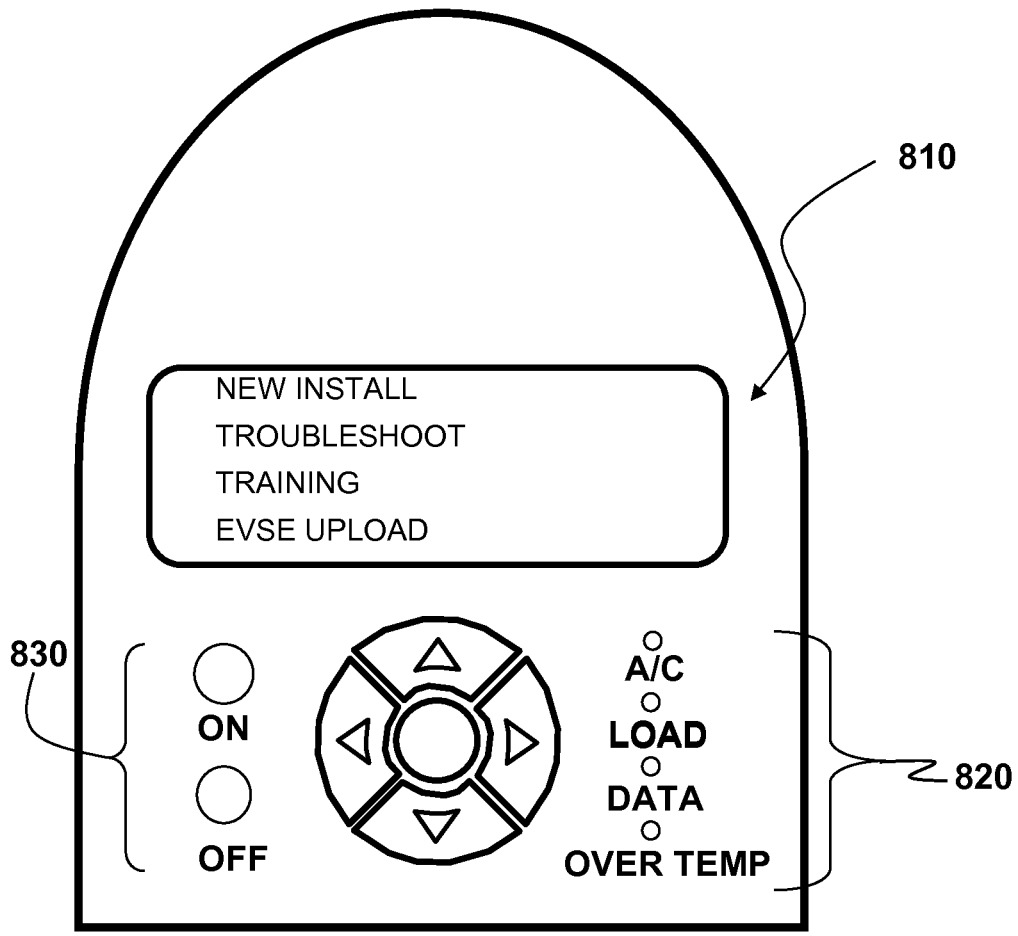
FIG. 8 is an exemplary depiction of an EVSA control panel.

The user interface 220 (FIG. 2) for the EVSE service tool 210 may be in various arrangements. An exemplary EVSE service tool (EVSA) control panel is depicted in FIG. 7. FIG. 7 depicts the exemplary control panel as having a line voltage readout 710, an array of status light 720, an array of binary switches 730, and an array of system voltage check lights 740. FIG. 8 is an exemplary depiction of another exemplary EVSE service tool (EVSA) control panel where there is a four line, 20 character display window 810, an array of status lights 820, a pair of discrete on/off buttons 830, and a five-key interface 840 for interacting with the display 810

Figure 9:
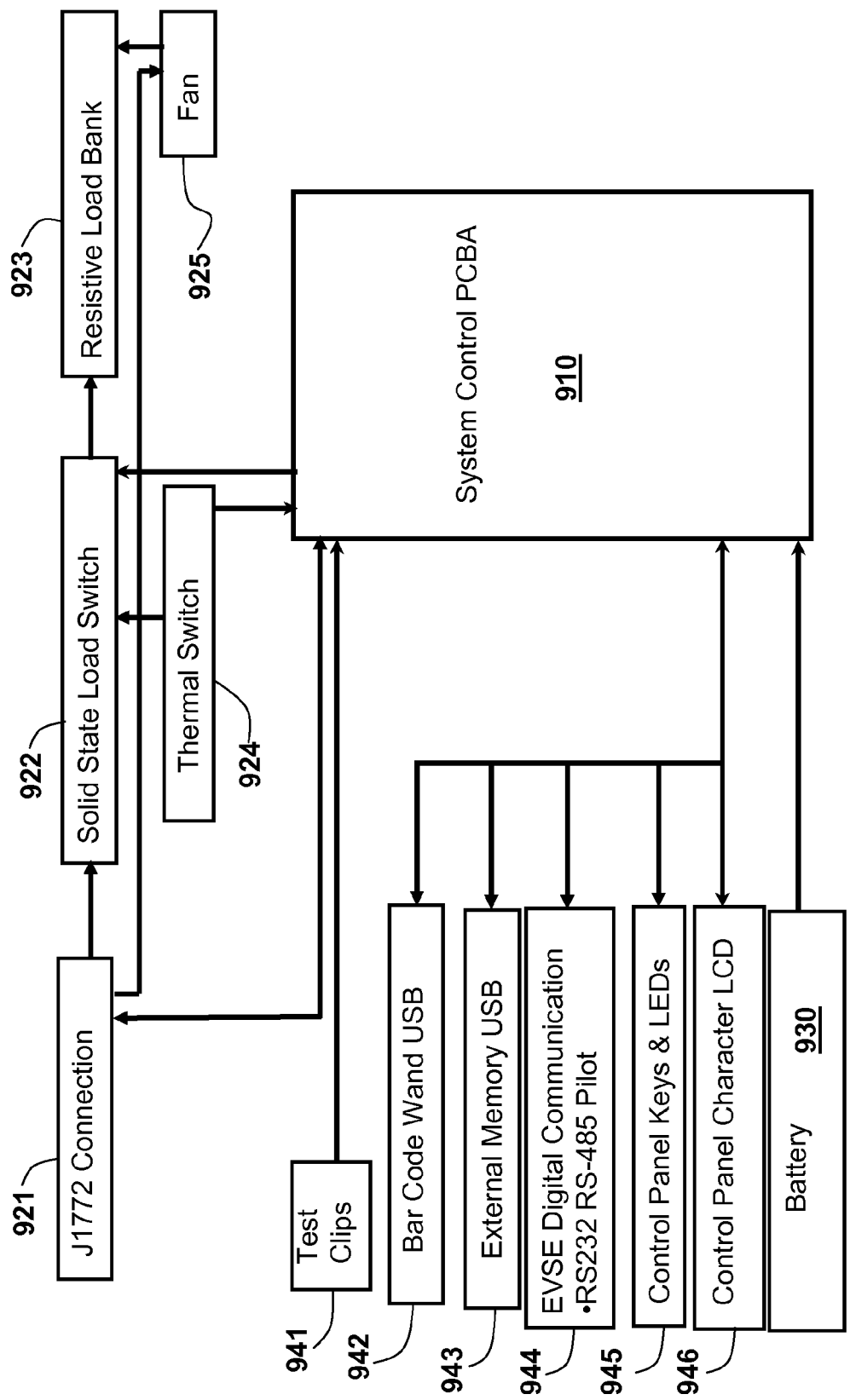
FIG. 9 is an exemplary system block diagram of the electrical system of an EVSA.

FIG. 9 is an exemplary system block diagram of the electrical system of an EVSA where the system control may be embodied via printed circuit board assembly (PCBA) 910. The system block diagram depicts a J1772 connection 921 in communication with the PCBA 910, in communication with a solid state load switch 922 which is in turn in communication with a resistive load bank 923. FIG. 9 depicts a thermal switch 924 in communication with the PCBA 910 and in communication with the solid state load switch 922. The J1772 connection 921 may invoke a fan circuit 925. The PCBA is depicted as connected to a battery 930. The system control PCBA 910 may receive input from one or more test clips 941, a bar code wand 942 or external memory 943 via a USB, EVSE digital communication, e.g., via RS 232, RS-485, and via the pilot line 944, one or more control panel keys 945, and optionally a control panel touch screen 946. The system control PCBA 910 may provide signals and/or data to the bar code wand 942 or external memory 943 via a USB, and/or digital communication RS 232/RS-485 to the EVSE via the pilot line 944, one or more control panel LCDs 945, and control panel characters of an LCD and/or LED display 946.

Figure 10:
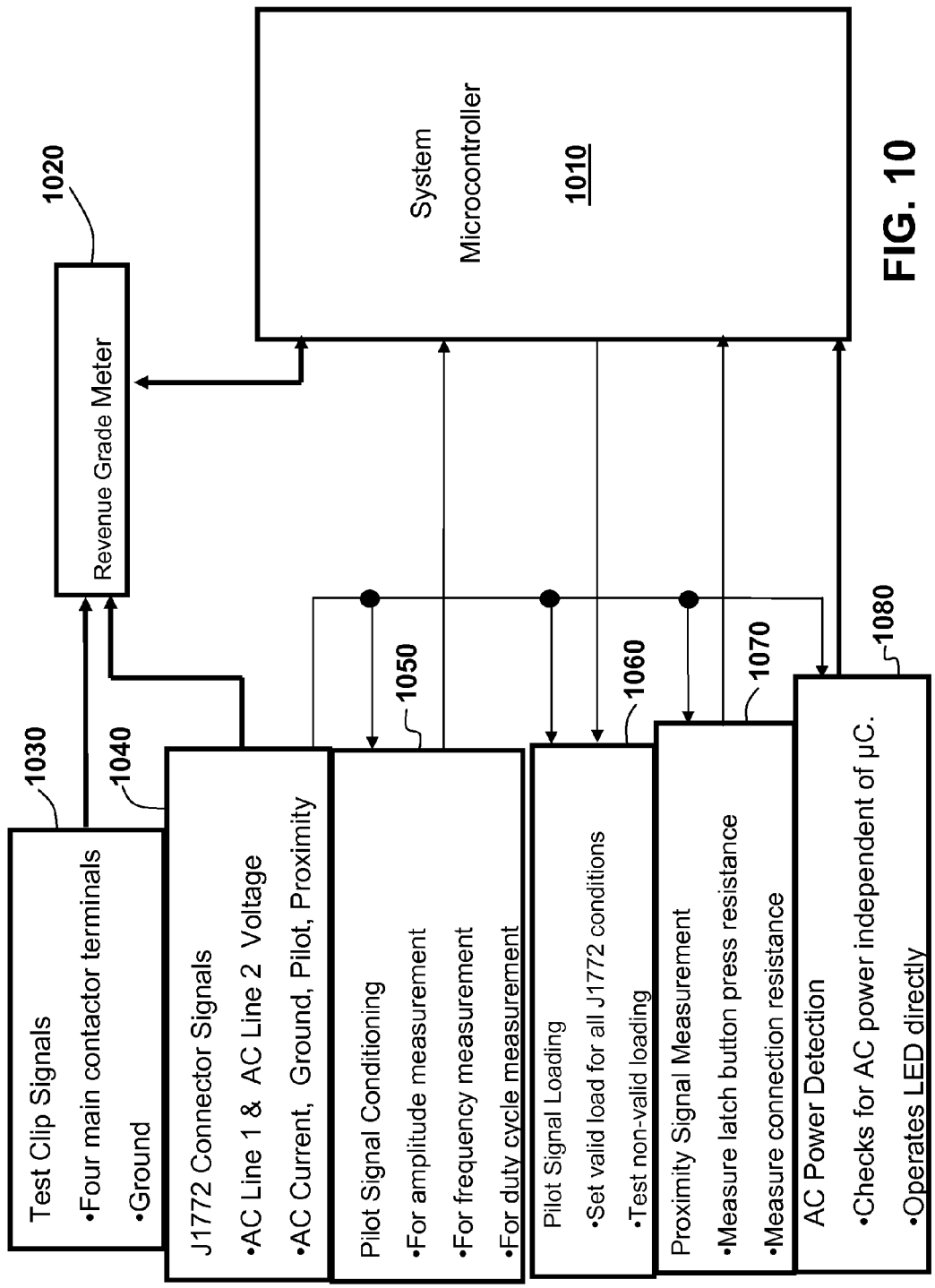
FIG. 10 is an exemplary functional block diagram for a printed circuit board assembly of an EVSA.

FIG. 10 is an exemplary functional block diagram for a printed circuit board assembly of an EVSA where the system microcontroller 1010 is in communication with a revenue grade meter 1020. The test clip signals 1030 are depicting as originating from four main contactor terminals and ground. The J1772 connector signals 1040 are depicted as comprising the AC Line 1 voltage, the AC line 2 voltage, the AC current, the ground, the pilot, and the proximity readings. The pilot signal conditioning 1050 is depicted as including signal condition for one or more amplitude measurements, for one or more frequency measurements, and for one or more duty cycle measurements. The pilot signal loading 1060 is depicted as setting a valid load for all expected J1772 conditions, and to test for non-valid loading. The proximity signal measurement circuitry 1070 is depicted as measuring the latch button press resistance and the connection resistance. The AC power detection circuitry 1080 is depicted as checking for AC power independent of the microcontroller, and may be configured to operate the LED directly.

Figure 11:
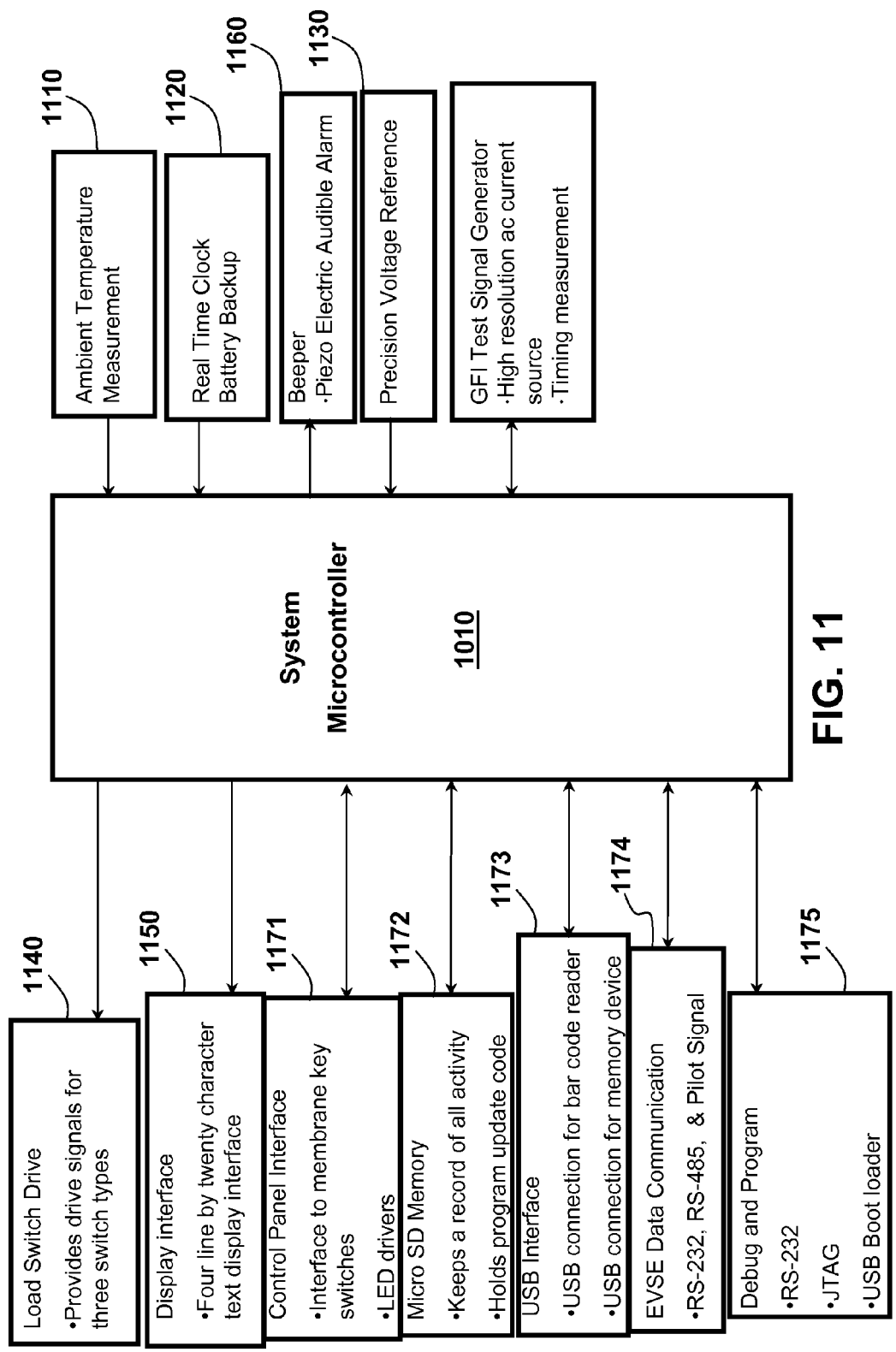
FIG. 11 is an exemplary functional block diagram for a printed circuit board assembly of an EVSA.

FIG. 11 is an exemplary functional block diagram for a printed circuit board assembly of an EVSA where the system microcontroller 1010 is depicted as receiving ambient temperature measurements 1110, real time clock input 1120, and a precision voltage reference 1130. The system microcontroller 1010 is depicted as providing command signals to a load switch drive 1140 that in turn provides drive signal for various switch types, e.g., three switch types. The system microcontroller 1010 is depicted as providing data for the display interface 1150, and providing a beeper signal for an audible alarm 1160. The system microcontroller 1010 is depicted as exchanging data with: (a) the control panel interface 1171 to interface with a membrane key switch (FIG. 8) and LED drivers; (b) flash memory or micro SD memory 1172 to record operational activity and to store program instructions update code; (c) a USB interface 1173 to enable a USB connection for a bar code reader and/or a USB connection for a memory device; (d) the EVSE via EVSE data communication 1174, i.e., via RS-232, RS-485, and the pilot signal; and (e) debug and program interfaces 1175, e.g., RS-232, JTAG, and/or USB boot loader.

Figure 12:
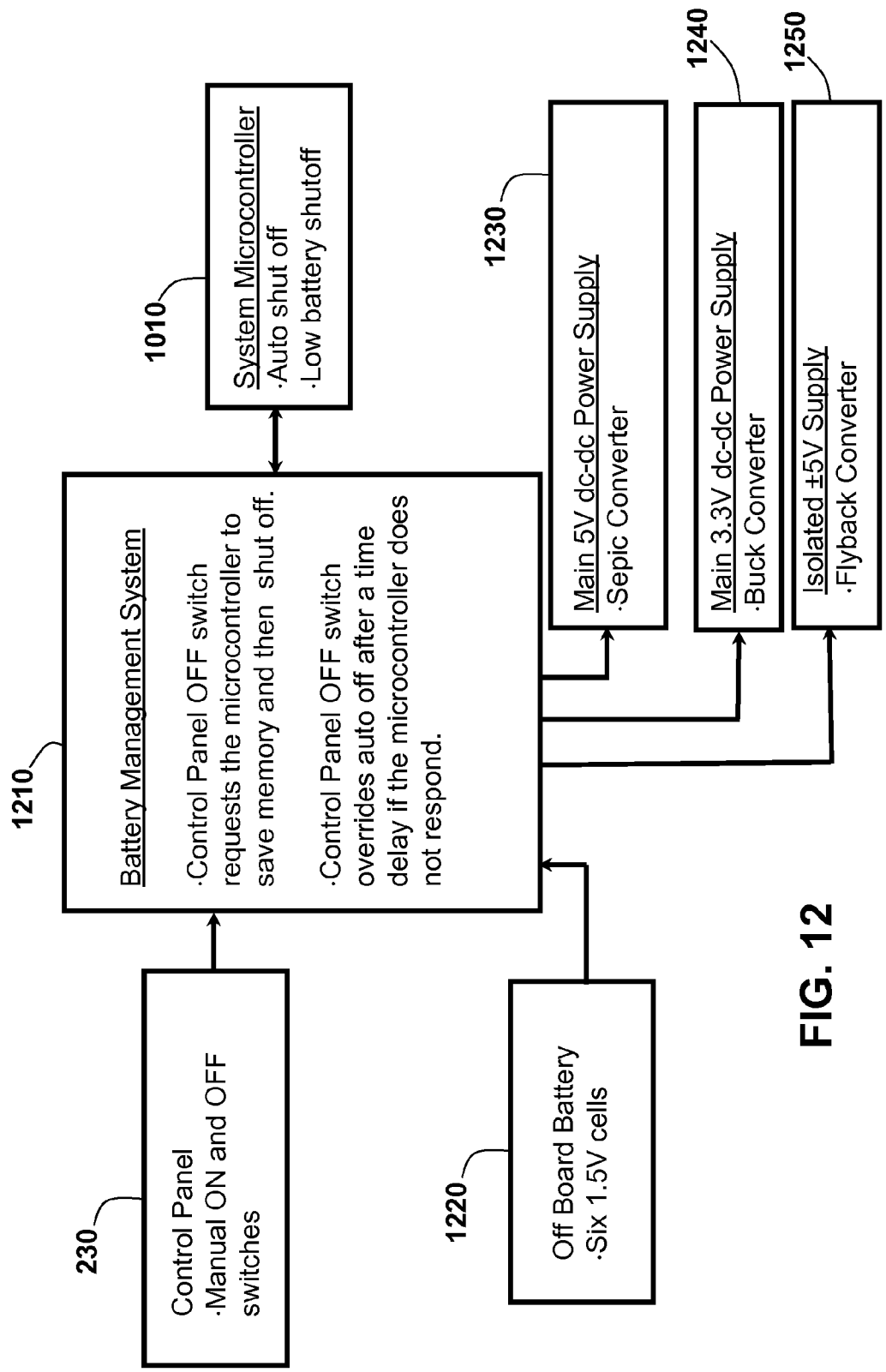
FIG. 12 is an exemplary functional block diagram for a printed circuit board assembly of an EVSA.

FIG. 12 is an exemplary functional block diagram for a printed circuit board assembly of an EVSA where the system microcontroller 1010 interfaces with a battery management system 1210 by providing an auto shut off command and/or a low battery shut off command. The battery management system 1210 is depicted as receiving from the control panel 230 the affect of manually effected on and off switches. The control panel OFF switch may function to request that the microcontroller 1010 save to memory and then shut off. The control panel OFF switch may override the auto off switch of the microcontroller 1010, if after a time delay the microcontroller does not responds with a memory save and then shut off. The battery management system 1210 is depicted as receiving power from an off-board battery 1220, e.g., six 1.5V cells. The battery management system 1210 is depicted as being configured to provide main 5V dc-dc power supply 1230, main 3.3 V dc-dc power supply 1240, and isolated plus or minus 5V supply 1250.

Figure 13:
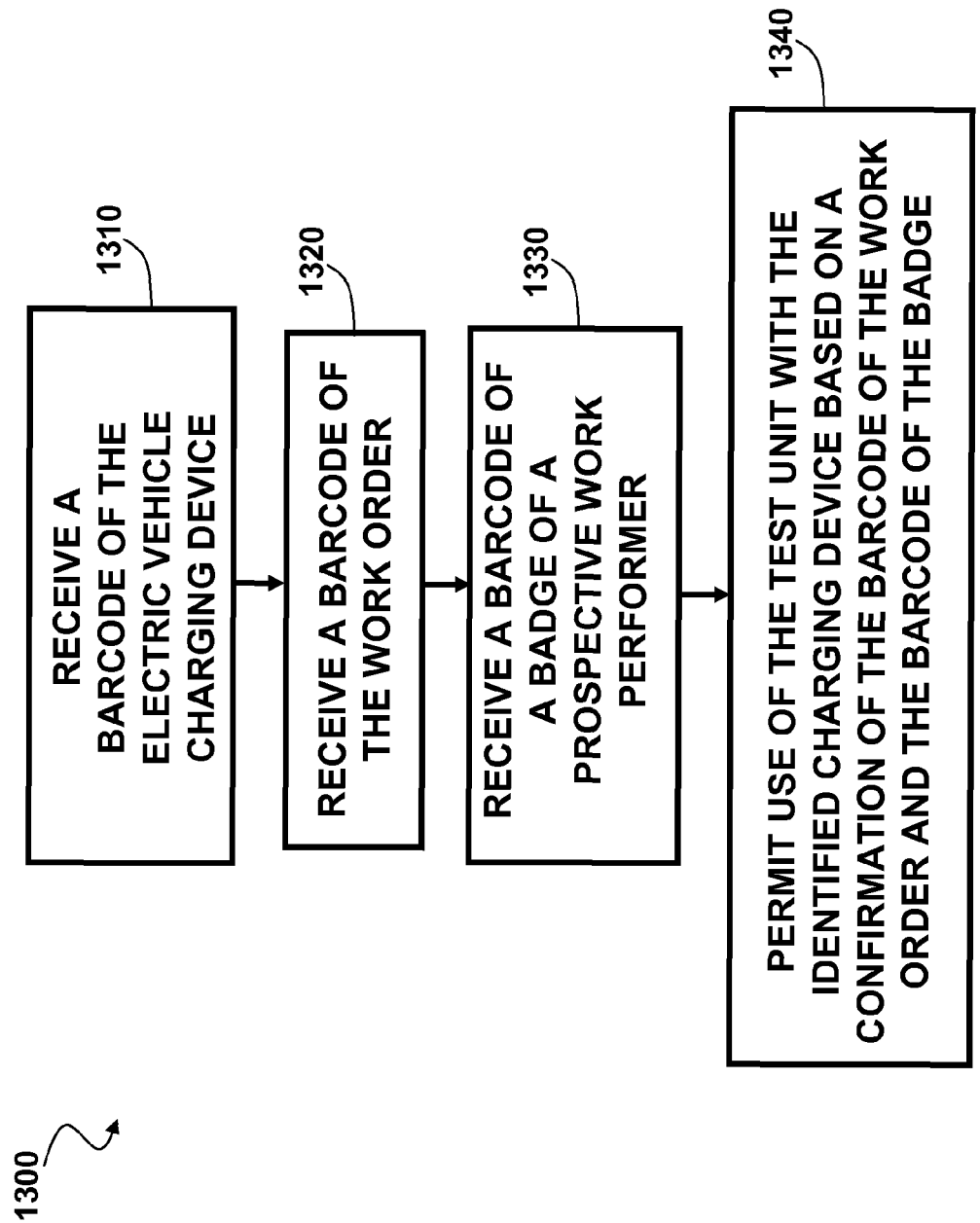
FIG. 13 is an exemplary flowchart for a method of permitting use of the EVSA that may be executed by the EVSA.

FIG. 13 is an exemplary flowchart 1300 for a method of permitting use of the EVSA, a method that may be executed by the EVSA where a test unit for evaluating an electric vehicle charging device, i.e., an EVSE, comprises a barcode reader input, and the microprocessor is configured by loading instructions from a memory store to: (a) receive a code, e.g., a read barcode of the electric vehicle charging device 1310; (b) receive a code, e.g., a read barcode of a work order 1320; and (c) receive a code, e.g., a read barcode of a badge of a person requesting to address the work order 1330. The configured microprocessor may grant permission 1340 for use of the test unit, i.e., the EVSE service tool (EVSA) with the electric vehicle charging device (EVSE) based on a confirmation of at least two of: (i) the code of the electric vehicle charging device; (ii) the code of a work order; and (iii) the code of the badge of the requesting person.

Figure 14:
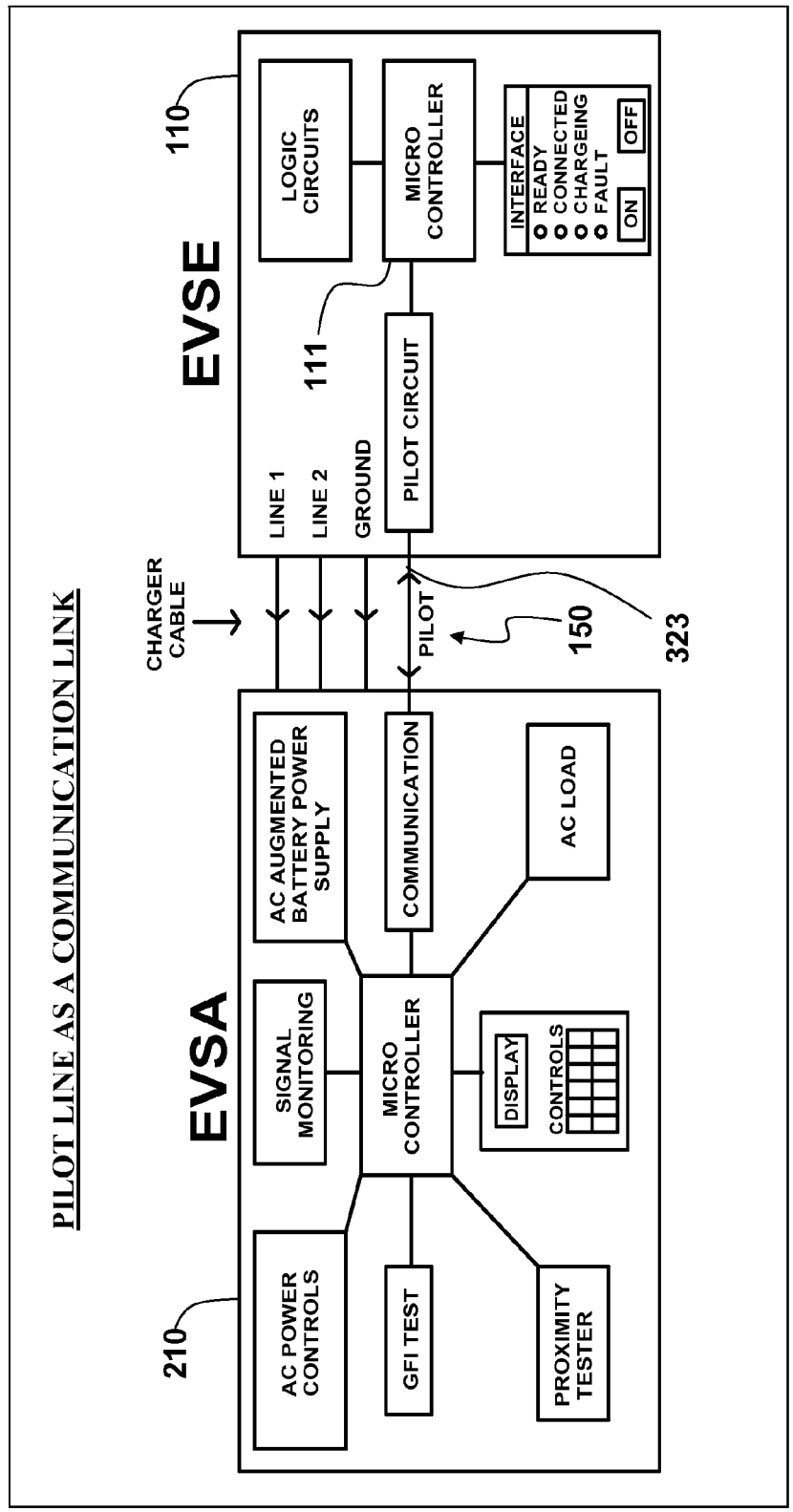
FIG. 14 is an exemplary functional block diagram depicting communication between the EVSA and the EVSE via the pilot line.
Figure 15A:
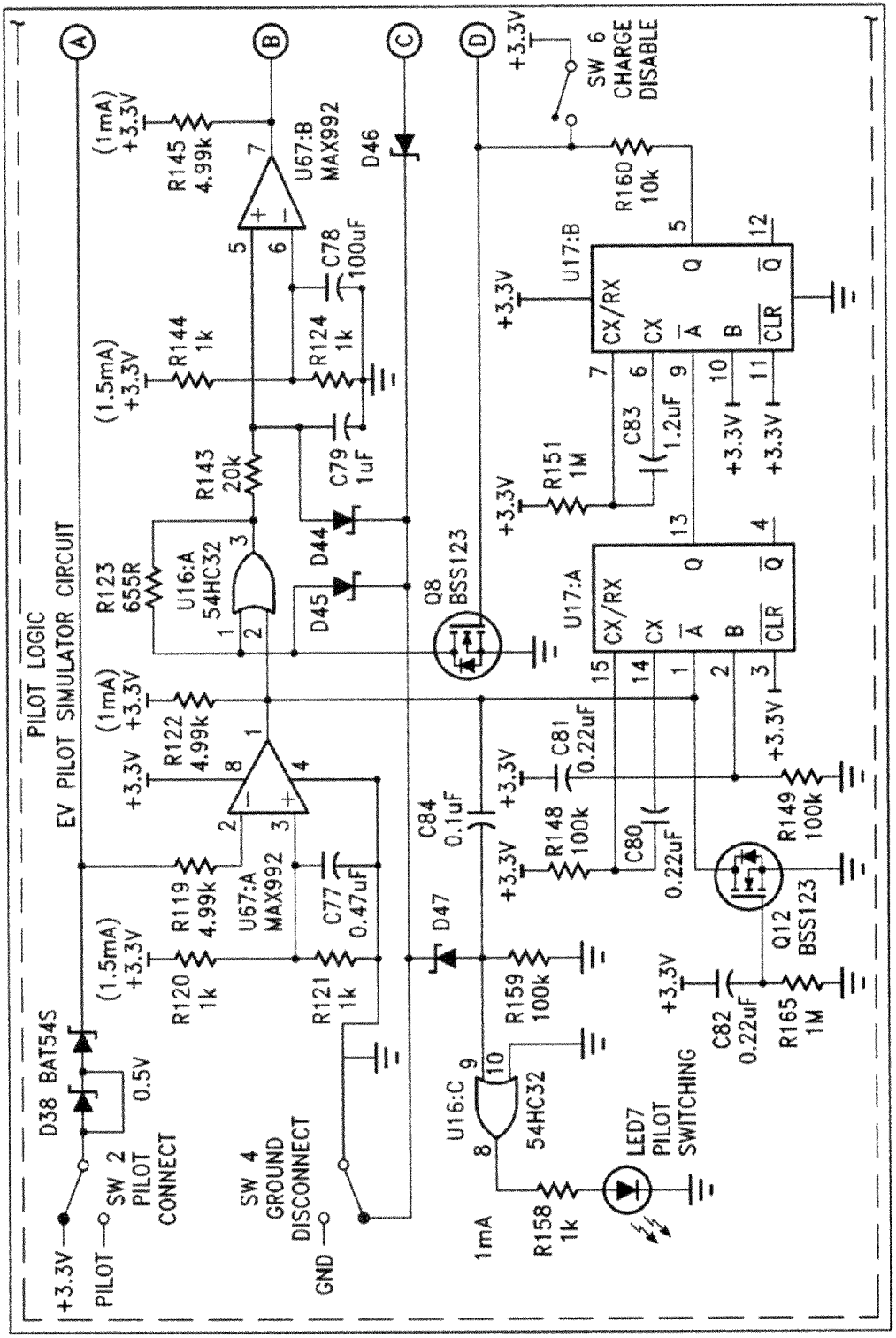
FIGS. 15A-15B illustrate an exemplary schematic depicting the simulation of the pilot line of an EV by the EVSA.
Figure 15B:
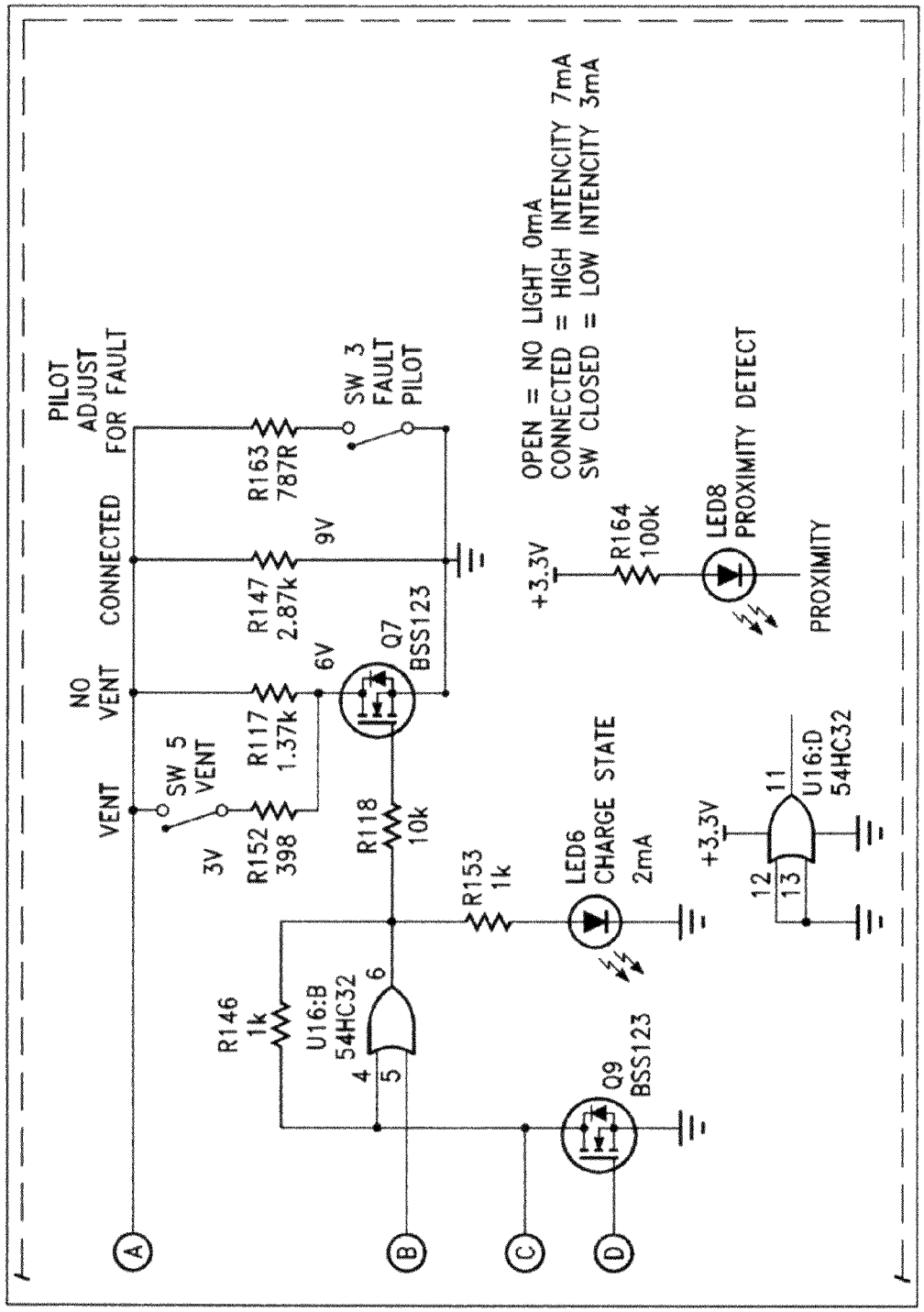

A charger cable may comprise AC Line 1, AC Line 2, a ground line, and a pilot line. Of the lines, the pilot line may provide for two-way communication. FIG. 14 is an exemplary functional block diagram depicting communication between the EVSA 210 and the EVSE 110 via the pilot line 323 of a charger cable 150. The pilot line 323 may be used to upload revised instructions for storage and execution by the microcontroller 111 of EVSE 110 where the EVSE may store such instructions in reprogrammable nonvolatile memory, e.g. flash memory. The EVSE service tool (EVSA) may also simulate the pilot signal circuitry of an electric vehicle. FIGS. 15A-15B illustrate an exemplary schematic depicting the simulation of the pilot line of an EV by the EVSA.

Figure 16:
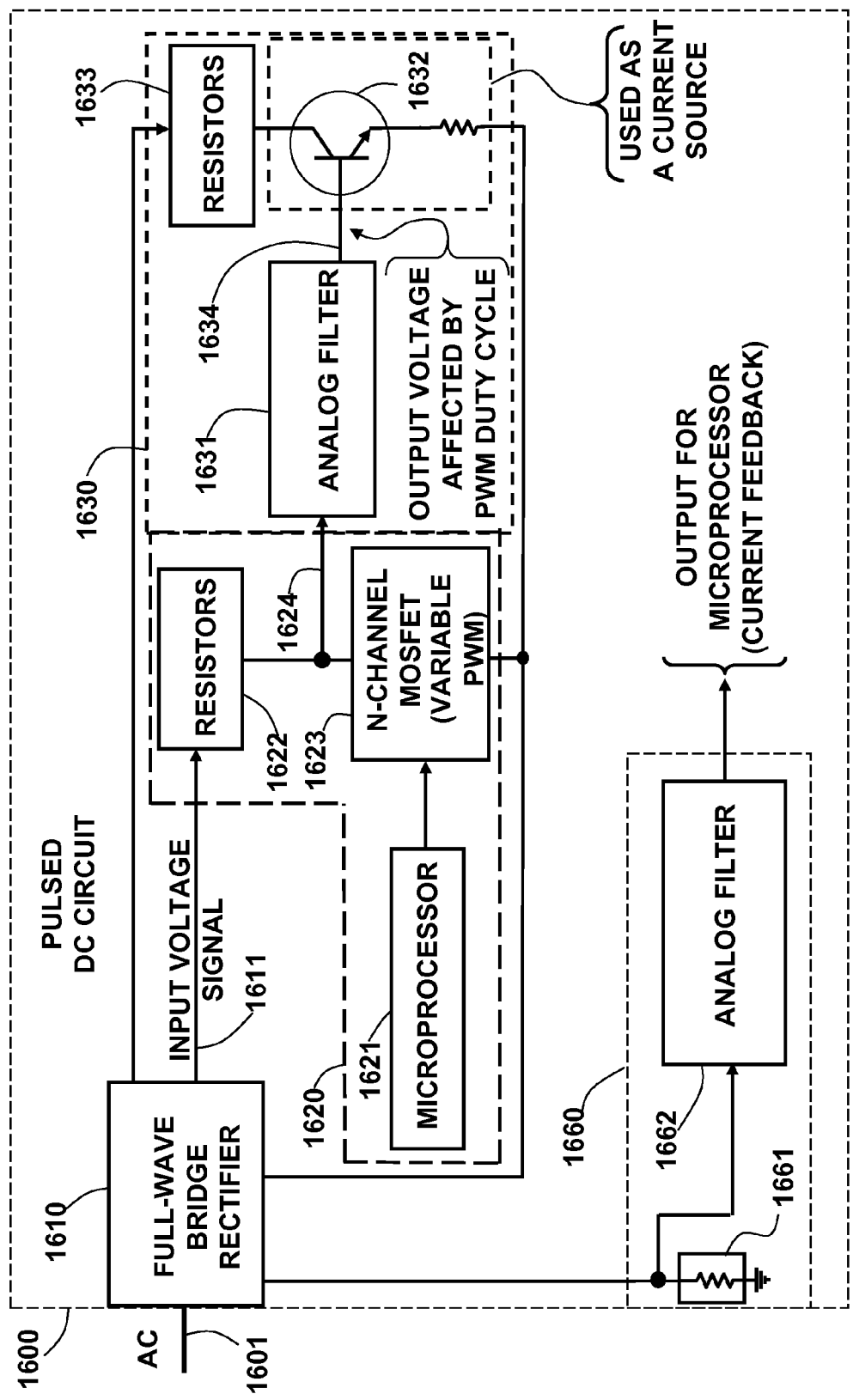
FIG. 16 is an exemplary functional block diagram depicting the simulation by the EVSA of a ground fault for testing the Ground Fault Interruption (GFI) circuit of the EVSE.

FIG. 16 is an exemplary functional block diagram depicting the simulation by the EVSA of a ground fault for testing the GFI circuit of the EVSE. That is, FIG. 16 is an exemplary functional block diagram of a pulsed DC circuit 1600 that produces a GFI current for test of the AC line 1601. The AC line 1601 is directed to a full-wave bridge rectifier 1610. The output of the full-wave bridge rectifier 1610 is an input signal 1611 that is directed to a modulating subsystem 1620 that produces an amplitude-adjusted version of the input voltage signal 1611 via pulse width modulation (PWM). An exemplary modulating subsystem 1620 is depicted as comprising a microprocessor 1621 external to the bridge, that may be in communication with a modulator inside the bridge via a digital signal isolator (not shown), a series of resistors 1622, and a high frequency switch, or modulator, such as an N-channel MOSFET 1623, for generating a PWM based on the PWM signal received from the microprocessor. The output, i.e., the modulated input voltage signal 1624, is directed to a voltage-to-current converter subsystem 1630 that is depicted as comprising: (a) an analog filter 1631, to reduce the PWM modulating chopping effect on the modulated input voltage signal 1624; (b) an NPN transistor 1632; and (c) a series of resistors 1633, to reduce the stress on the transistor 1632. The analog filter output 1634 has a voltage affected by the PWM duty cycle, and in turn affects the base voltage of the transistor 1632. A current-to-voltage subsystem is depicted by 1660 where the resistor 1661 between the full-wave bridge rectifier X10 and ground allows for an analog filter 1662 to measure the GFI current, and convert the measured GFI current into a voltage. The voltage signal may then be converted to a digital signal for use by a microprocessor for feedback control of the GFI current.

Figure 17:
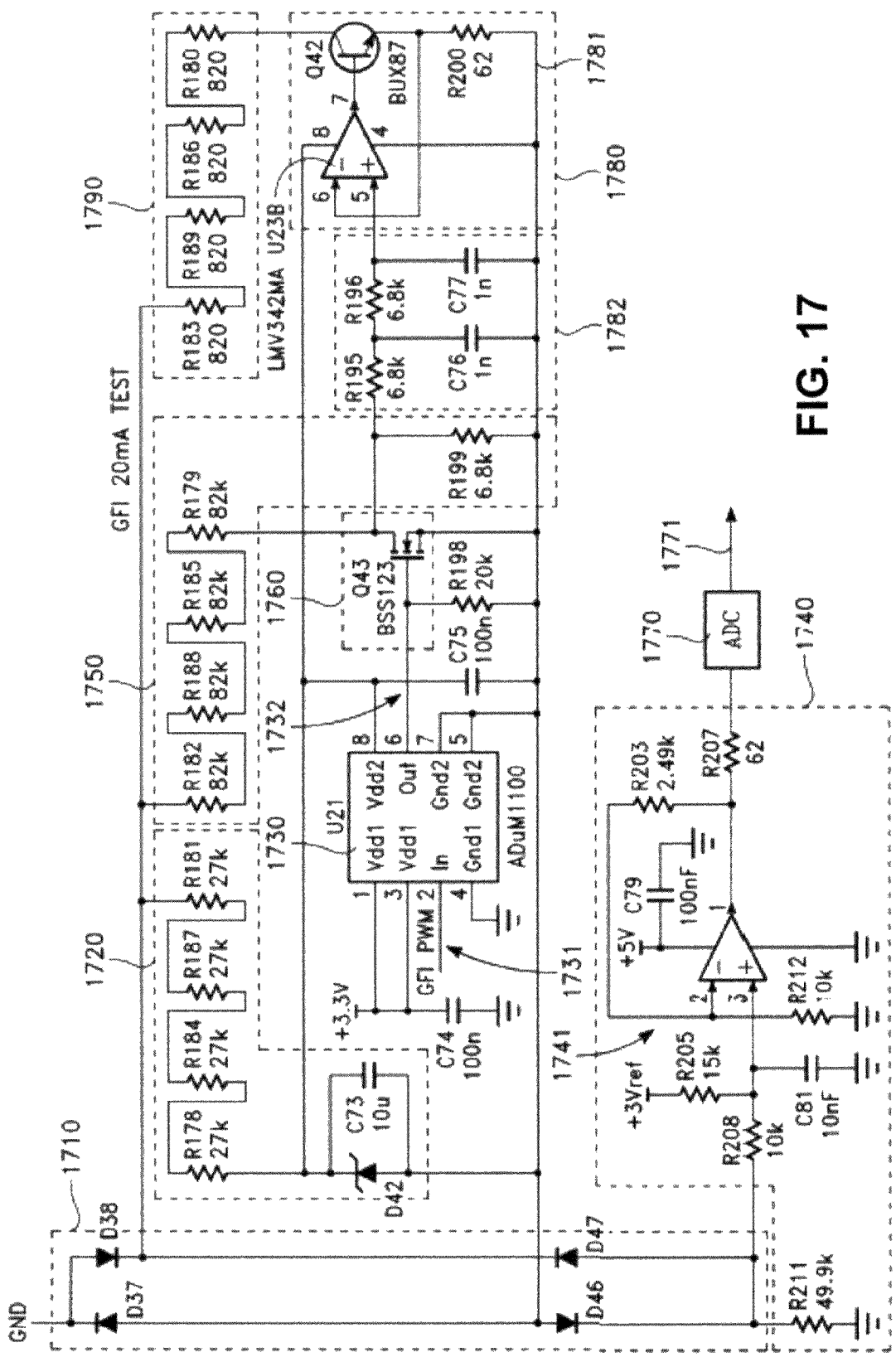
FIG. 17 is an exemplary schematic depicting the simulation by the EVSA of a ground fault for testing the GFI circuit of the EVSE.

FIG. 17 is an exemplary schematic depicting the simulation by the EVSA of a ground fault for testing the GFI circuit of the EVSE, e.g., a GFI 20 mA test. That is, FIG. 17 is an exemplary schematic embodiment of the preceding functional block diagram where a full-wave bridge rectifier 1710 provides rectified AC as the input voltage signal to a power supply 1720. A voltage divider 1750 may produce an output signal proportional to the input voltage signal. A digital signal isolator 1730 is depicted as taking in a GFI PWM modulation signal 1731 at pin 2, and outputs as pin 6 a GFI PWM signal 1732. A voltage divider 1750 may produce an output signal proportional to the input voltage signal. A modulator 1760 is depicted as an N-channel MOSFET that may provide linear adjustments to the voltage divider ratio as a function of the duty cycle of the GFI PWM signal 1732. A low pass filter 1782 attenuates the chopping signal of the modulator 1760. A voltage-to-current converter 1780 may produce the GFI current 1781 as a function of the input voltage signal from the modulator 1760. A current-to-voltage converter 1740 is depicted as configured to measure the GFI current and convert 1741 the measurement to a voltage. The voltage signal may then be converted 1770, via an analog-to-digital convert (ADC) 1770 to a digital signal 1771 for use by a microcontroller (not shown) for feedback control of the GFI current X81.

Figure 18:
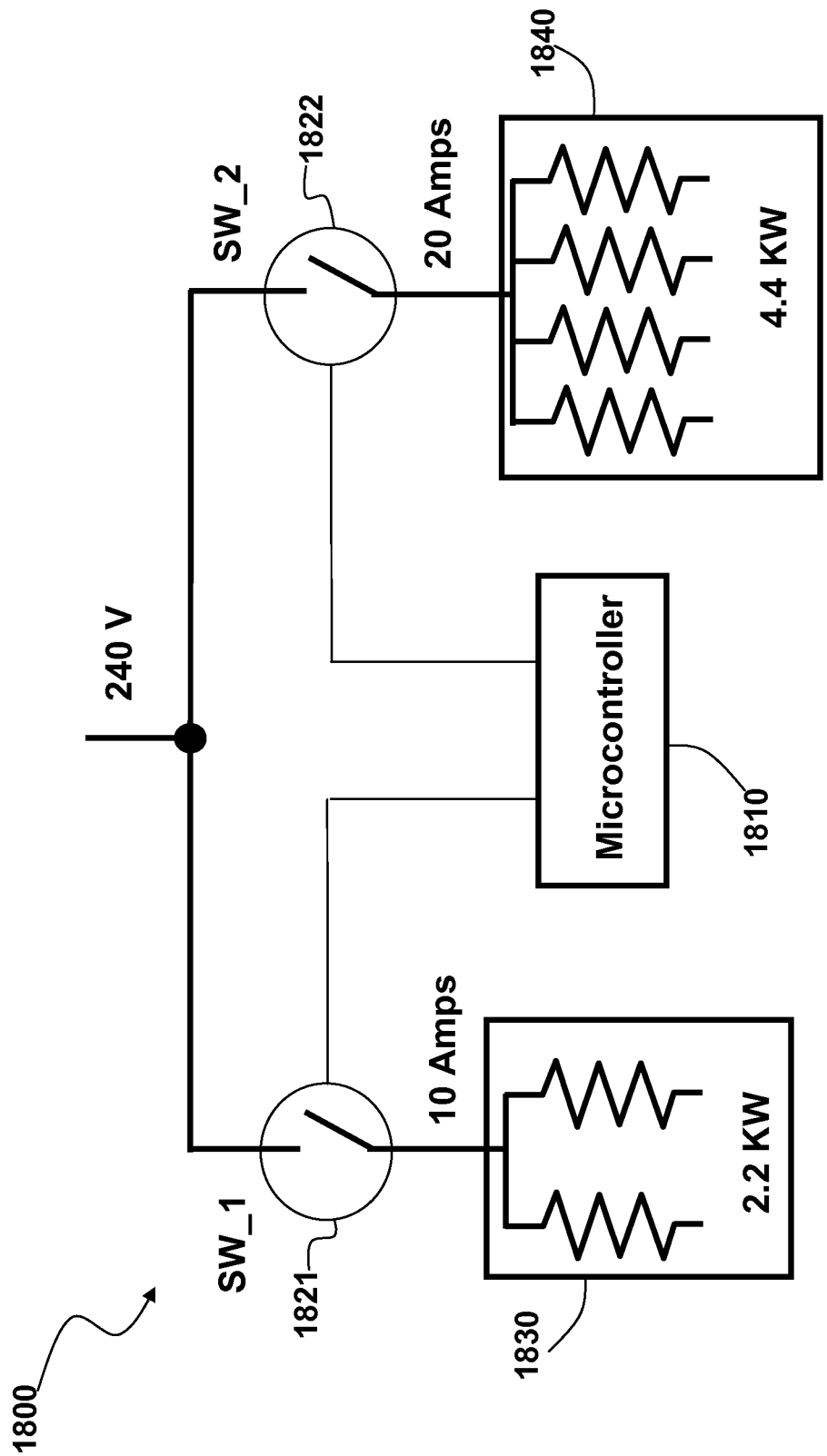
FIG. 18 is a functional block diagram depicting the load switching circuitry of the EVSA.

FIG. 18 is a functional block diagram depicting the load switching circuitry of the EVSA. That is, FIG. 18 depicts a switchable load embodiment 1800 of a test unit where a microcontroller 1810 controls a plurality of switches, e.g., a first switch 1821, SW_1, and a second switch 1822, SW_2. A first resistor bank 1830 comprises two resistors, each sized to draw five amps at 240 volts, e.g., 48 ohms. A second resistor bank 1840 comprises four resistors, each sized to draw five amperes of current at 240 volts, i.e., 48 ohms. The microcontroller 1810 may close the first switch 1821, SW_1, where the input voltage is 240V. Accordingly, the first resistor bank 1830 may draw 10 amps and provide a load of 2.4 kVA, about 2.4 kilowatts for a power factor less than unity. The microcontroller 1810 may leave open the first switch 1821, SW_1, and close the second switch 1822, SW_2. The second resistor bank 1840 may draw 20 amperes and provide a load of 4.8 kVA, i.e., about 4.8 kW. The microcontroller 1810 may close both the first switch 1821, SW_1 and the second switch 1822, SW_2. The combined first resistor bank 1830 and second resistor bank 1840 may draw 30 amperes and provide a load of 7.2 kVA, i.e., about 7.2 kW. Accordingly, embodiments of a test unit may simulate the load of one of three electric vehicle levels while using two resistor banks That is, by microcontroller effected switches, banks of resistors may be used in combination to reduce the number of total resistors required for a desired range of loads, e.g., 2.2 kW, 4.4, kW, and 6.6 kW for available EVs.

It is contemplated that various combinations and/or subcombinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further it is intended that the scope of the present invention herein disclosed by way of examples should not be limited by the particular disclosed embodiments described above.

What is claimed is:

1. A device comprising:
    a charge plug interface connected to simulation circuitry, the simulation circuitry comprising:
        a means for simulating pilot line feedback;
        a means for simulating electric vehicle load; and
        a means for simulating a ground fault interrupt current.

2. The device of claim 1 wherein the means for simulating pilot line feedback comprises circuitry configured to initiate a pilot voltage drop to confirm readiness to accept energy.

3. The device of claim 1 wherein the means for simulating electric vehicle load comprises a plurality of resistor banks, selectable via microcontroller-controlled switches, having a load approximating an expected load of an electric vehicle.

4. The device of claim 1 wherein the means for simulating a ground fault interrupt current comprises a modulator circuit comprising a modulator generating a pulse width modulating signal having a microcomputer-controlled duty cycle.

* * * * *